(12) United States Patent
Gao et al.

(10) Patent No.: US 11,264,440 B2
(45) Date of Patent: Mar. 1, 2022

(54) OLED DISPLAY PANEL AND DISPLAY DEVICE HAVING A MULTI-LAYERED RETAINING WALL

(71) Applicant: Wuhan China Star Optoelectronics Semiconductor Display Technology Co., Ltd., Wuhan (CN)

(72) Inventors: Hong Gao, Wuhan (CN); Mugyeom Kim, Wuhan (CN); Yong Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/884,049

(22) Filed: May 27, 2020

(65) Prior Publication Data
US 2021/0305335 A1 Sep. 30, 2021

(30) Foreign Application Priority Data
Mar. 30, 2020 (CN) .......................... 202010237821.2

(51) Int. Cl.
*H01L 27/32* (2006.01)
*H01L 51/00* (2006.01)
*H01L 51/52* (2006.01)

(52) U.S. Cl.
CPC ........ *H01L 27/3246* (2013.01); *H01L 27/323* (2013.01); *H01L 51/0097* (2013.01); *H01L 51/5253* (2013.01); *H01L 51/5293* (2013.01); *H01L 2251/301* (2013.01); *H01L 2251/5338* (2013.01)

(58) Field of Classification Search
CPC .............. H01L 27/3246; H01L 27/323; H01L 27/3295; H01L 51/0097; H01L 51/5253; H01L 51/5293; H01L 2251/5338; H01L 2251/301

See application file for complete search history.

(56) References Cited

U.S. PATENT DOCUMENTS

| | | | | |
|---|---|---|---|---|
| 9,818,807 B2 * | 11/2017 | Park | ..................... | H01L 51/5253 |
| 10,068,954 B2 * | 9/2018 | Kim | ..................... | H01L 27/3251 |
| 10,134,904 B2 * | 11/2018 | Adachi | ............... | H01L 27/1222 |
| 10,727,450 B2 * | 7/2020 | Yun | ......................... | H01L 51/56 |
| 10,749,142 B2 * | 8/2020 | Kim | ..................... | H01L 51/5012 |
| 10,777,771 B2 * | 9/2020 | Lee | ..................... | H01L 27/3276 |
| 10,854,846 B2 * | 12/2020 | Kim | ....................... | G09G 3/006 |
| 10,861,909 B2 * | 12/2020 | Park | ..................... | H01L 27/3244 |

(Continued)

*Primary Examiner* — Ida M Soward

(57) ABSTRACT

An organic light emitting diode (OLED) display panel and a display device are provided. A retaining wall of the OLED display panel includes a substrate retaining wall layer, an inorganic retaining wall layer, and an organic retaining wall layer stacked on each other. Based on a structure of the retaining wall, a height of the retaining wall is increased, which can better block movements of organic materials and reduce a distance between the retaining wall and a display region. Meanwhile, the undercut shape between the retaining wall and the display region can also increase moving paths of the organic materials, which can further reduce the distance between the retaining wall and the display region, and can prevent cutting cracks from extending to the display region along the inorganic layer and a substrate, which can further reduce frame sizes.

10 Claims, 13 Drawing Sheets

(56) References Cited

U.S. PATENT DOCUMENTS

| | | | |
|---|---|---|---|
| 10,868,088 B2* | 12/2020 | Bok | H01L 27/323 |
| 10,930,884 B2* | 2/2021 | Lee | H01L 51/5246 |
| 10,998,520 B2* | 5/2021 | Hong | H01L 51/5246 |
| 11,005,072 B2* | 5/2021 | Shin | H01L 27/3246 |
| 11,094,762 B2* | 8/2021 | Han | H01L 27/3246 |
| 2019/0334120 A1* | 10/2019 | Seo | H01L 51/5246 |
| 2020/0119304 A1* | 4/2020 | Choi | H01L 51/5253 |
| 2020/0168671 A1* | 5/2020 | Jang | G06F 3/04164 |
| 2020/0176520 A1* | 6/2020 | Kim | H01L 51/5246 |
| 2020/0194534 A1* | 6/2020 | Park | H01L 27/322 |
| 2020/0212140 A1* | 7/2020 | Huh | H01L 27/326 |
| 2020/0303664 A1* | 9/2020 | Choi | H01L 51/0097 |
| 2020/0321406 A1* | 10/2020 | Lee | H01L 27/323 |
| 2021/0091320 A1* | 3/2021 | Choi | H01L 27/323 |
| 2021/0111374 A1* | 4/2021 | Sung | H01L 51/0097 |

\* cited by examiner

OLED DISPLAY PANEL AND DISPLAY DEVICE HAVING A MULTI-LAYERED RETAINING WALL

RELATED APPLICATION

This application claims the benefit of priority of Chinese Patent Application No. 202010237821.2 filed on Mar. 30, 2020, the contents of which are incorporated herein by reference in their entirety.

FIELD AND BACKGROUND OF THE INVENTION

The present invention relates to the field of display technologies, and in particular, to an organic light emitting diode (OLED) display panel and a display device.

In OLED technologies, by setting retaining walls in frame regions to prevent organic layers of packaging layers from moving towards frames, thereby reducing areas occupied by the frames. However, there are still some areas between the retaining walls and display regions that cannot display. Meanwhile, when cutting motherboards, cutting cracks will extend to the display regions. At this time, in order to ensure quality of display panels, it is necessary to retain larger-size frames.

That is, the frames of current OLED display panels are still large and need further improvement.

The frames of current OLED display panels are still large and need further improvement.

SUMMARY OF THE INVENTION

The present invention provides an organic light emitting diode (OLED) display panel and a display device, so as to alleviate technical problems that current OLED display panels have larger frame sizes.

In order to solve the above problems, technical solutions provided by the present invention are as follows:

An embodiment of the present invention provides an OLED display panel, which comprises:

a flexible substrate comprising a first flexible substrate, a first inorganic layer, and a second flexible substrate;

a driving circuit layer disposed on the second flexible substrate;

a planarization layer disposed on the driving circuit layer;

a pixel definition layer disposed on the planarization layer;

a light emitting functional layer disposed on the driving circuit layer;

a support column disposed on the pixel definition layer;

a retaining wall disposed between a cutting region and a display region; and a packaging layer disposed on the light emitting functional layer, the pixel definition layer, and the retaining wall;

wherein the retaining wall comprises a substrate retaining wall layer, an inorganic retaining wall layer, and an organic retaining wall layer stacked on each other, cross-sections of the inorganic retaining wall layer and the substrate retaining wall layer form an undercut shape, the substrate retaining wall layer comprises the second flexible substrate, the inorganic retaining wall layer comprises an inorganic layer in the driving circuit layer, and the organic retaining wall layer comprises at least one of the planarization layer, the pixel definition layer, and the support column.

In the OLED display panel provided by the embodiment of the present invention, the cutting region is disposed outside the display region, and the retaining wall is disposed in a frame between the cutting region and the display region.

In the OLED display panel provided by the embodiment of the present invention, the retaining wall is disposed around the display region.

In the OLED display panel provided by the embodiment of the present invention, the cutting region is disposed in the display region, and the retaining wall is disposed in a buffer region between the cutting region and the display region.

In the OLED display panel provided by the embodiment of the present invention, the retaining wall is disposed around the cutting region.

In the OLED display panel provided by the embodiment of the present invention, the cutting region comprises a panel cutting region and a via hole cutting region, the retaining wall comprises a first retaining wall and a second retaining wall, the first retaining wall is disposed on a frame between the cutting region and the display region, and the second retaining wall is disposed on a buffer region between the via hole cutting region and the display region.

In the OLED display panel provided by the embodiment of the present invention, the first retaining wall is disposed around the display region, and the second retaining wall is disposed around the cutting region.

In the OLED display panel provided by the embodiment of the present invention, a contact area of the substrate retaining wall layer and the inorganic retaining wall layer is greater than a contact area of the organic retaining wall layer and the inorganic retaining wall layer.

In the OLED display panel provided by the embodiment of the present invention, the packaging layer comprises:

a first inorganic packaging layer covering the retaining wall, the planarization layer, the pixel definition layer, the light emitting functional layer, and the support column, and extending to the cutting region;

an organic packaging layer covering a portion of the first inorganic packaging layer disposed in the display region and extending to a side of the retaining wall close to the display region;

a second inorganic packaging layer covering the organic packaging layer and a portion of the first inorganic packaging layer not covered by the organic packaging layer; and an organic planarization layer disposed on an uneven region of the second inorganic packaging layer.

An embodiment of the present invention further provides a display device, which comprises:

the above OLED display panel;
a touch panel disposed on the OLED display panel;
a polarizer disposed on the touch panel; and
a protective cover.

The beneficial effects of the present invention are: The present invention provides an OLED display panel and a display device. The OLED display panel comprises: a flexible substrate comprising a first flexible substrate, a first inorganic layer, and a second flexible substrate; a driving circuit layer disposed on the second flexible substrate; a light emitting functional layer disposed on the driving circuit layer; a packaging layer disposed on the light emitting functional layer, a pixel definition layer, and a retaining wall disposed between a cutting region and a display region; the retaining wall comprises a substrate retaining wall layer, an inorganic retaining wall layer, and an organic retaining wall layer stacked on each other, cross-sections of the inorganic retaining wall layer and the substrate retaining wall layer form an undercut shape, the substrate retaining wall layer comprises the second flexible substrate, the inorganic retaining wall layer comprises an inorganic layer in the driving circuit layer, and the organic retaining wall layer comprises at least one of a planarization layer, the pixel definition layer, and a support column. Based on the retaining wall structure, a height of the retaining wall is increased, which can better block movements of organic materials and reduce a distance between the retaining wall and the display region. Meanwhile, the undercut shape between the retaining wall and the display region can also increase moving paths of the organic materials, which can further reduce the distance between the retaining wall and the display region, and can prevent cutting cracks from extending to the display region along the inorganic layer and a substrate, which can further reduce frame sizes. That is, embodiments of the present invention can further reduce the frame sizes and increase screen ratios.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DESCRIPTION OF SPECIFIC EMBODIMENTS OF THE INVENTION

Figure 1:
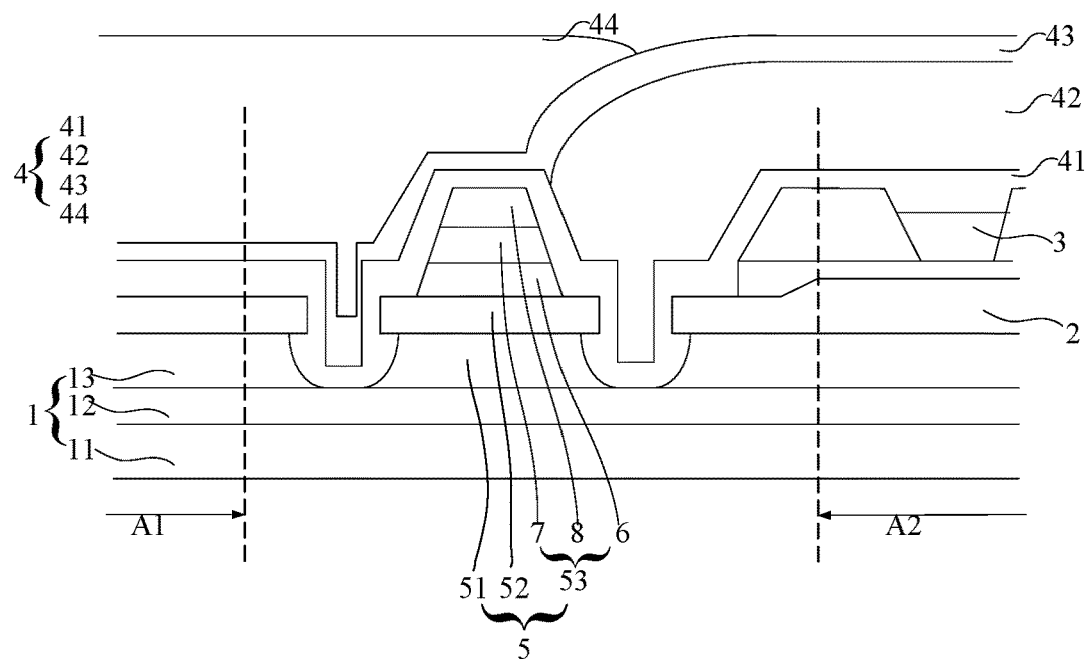
FIG. 1 is a schematic cross-sectional view of a retaining wall of an organic light emitting diode (OLED) display panel provided by an embodiment of the present invention.

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

In the drawings, in order to clearly show devices, thicknesses of layers and regions are exaggerated. The same reference numbers indicate the same components throughout the specification and drawings.

In view of a technical problem that a frame of a current organic light emitting diode (OLED) display panel is still relatively large, and embodiments of the present invention can alleviate.

In an embodiment, as shown in FIG. 1, an array substrate provided by the embodiment of the present invention comprises:

a flexible substrate 1 comprising a first flexible substrate 11, a first inorganic layer 12, and a second flexible substrate 13;

a driving circuit layer 2 disposed on the second flexible substrate 13;

a planarization layer 6 disposed on the driving circuit layer;

a pixel definition layer 7 disposed on the planarization layer;

a light emitting functional layer 3 disposed on the driving circuit layer 2;

a support column 8 disposed on the pixel definition layer;

a retaining wall 5 disposed between a cutting region A1 and a display region A2; and a packaging layer 4 disposed on the light emitting functional layer, the pixel definition layer, and the retaining wall;

wherein the retaining wall 5 comprises a substrate retaining wall layer 51, an inorganic retaining wall layer 52, and an organic retaining wall layer 53 stacked on each other, cross-sections of the inorganic retaining wall layer and the substrate retaining wall layer form an undercut shape, the substrate retaining wall layer comprises the second flexible substrate, the inorganic retaining wall layer comprises an inorganic layer in the driving circuit layer, and the organic retaining wall layer comprises at least one of the planarization layer, the pixel definition layer, and the support column.

In an embodiment, the support column 8 is formed by remaining regions of the pixel definition layer 7.

The embodiment provides an OLED display panel. The OLED display panel comprises: the flexible substrate comprising a first flexible substrate, a first inorganic layer, and a second flexible substrate; a driving circuit layer disposed on the second flexible substrate; a light emitting functional layer disposed on the driving circuit layer; a packaging layer disposed on the light emitting functional layer, a pixel definition layer, and a retaining wall disposed between a cutting region and a display region; the retaining wall comprises a substrate retaining wall layer, an inorganic retaining wall layer, and an organic retaining wall layer stacked on each other, cross-sections of the inorganic retaining wall layer and the substrate retaining wall layer form an undercut shape, the substrate retaining wall layer comprises the second flexible substrate, the inorganic retaining wall layer comprises an inorganic layer in the driving circuit layer, and the organic retaining wall layer comprises at least one of a planarization layer, the pixel definition layer, and a support column. Based on the retaining wall structure, a height of the retaining wall is increased, which can better block movements of organic materials and reduce a distance between the retaining wall and the display region. Meanwhile, the undercut shape between the retaining wall and the display region can also increase moving paths of the organic materials, which can further reduce the distance between the retaining wall and the display region, and can prevent cutting cracks from extending to the display region along the inorganic layer and a substrate, which can further reduce frame sizes. That is, embodiments of the present invention can further reduce the frame sizes and increase screen ratios.

In an embodiment, a cross-section of an undercut structure is an opening that is small at the top and large at the bottom.

In an embodiment, the cutting region A1 is disposed outside the display region A2, and the retaining wall 5 is disposed in a frame between the cutting region and the display region.

In an embodiment, the retaining wall 5 is disposed around the display region to reduce sizes of all frame regions.

In an embodiment, the cutting region is disposed outside the display region. At this time, the cutting region is cut to form a lighting region of a camera under screen, and the retaining wall is disposed in a buffer region between the cutting region and the display region.

In an embodiment, the retaining wall is disposed around the cutting region.

In an embodiment, the cutting region comprises a panel cutting region and a via hole cutting region, the retaining wall comprises a first retaining wall and a second retaining wall, the first retaining wall is disposed on the frame between the cutting region and the display region, and the second retaining wall is disposed on a buffer region between the via hole cutting region and the display region.

In an embodiment, the first retaining wall is disposed around the display region, and the second retaining wall is disposed around the cutting region.

In an embodiment, in a same region, two or more number of retaining walls 5 may be provided.

In an embodiment, as shown in FIG. 1, a contact area of the substrate retaining wall layer and the inorganic retaining wall layer is greater than a contact area of the organic retaining wall layer and the inorganic retaining wall layer.

In an embodiment, as shown in FIG. 1, the contact area of the substrate retaining wall layer and the inorganic retaining wall layer is smaller than an area of the inorganic retaining wall layer, and a contact area of the organic retaining wall layer and the inorganic retaining wall layer is smaller than the area of the inorganic retaining wall layer.

In an embodiment, as shown in FIG. 1, the packaging layer 4 comprises:

a first inorganic packaging layer 41 covering the retaining wall 5, the planarization layer 6, the pixel definition layer 7, the light emitting functional layer 3, and the support column 8, and extending to the cutting region A1;

an organic packaging layer 42 covering a portion of the first inorganic packaging layer 41 disposed in the display region A2 and extending to a side of the retaining wall 5 close to the display region A2;

a second inorganic packaging layer 43 covering the organic packaging layer 42 and a portion of the first inorganic packaging layer 41 not covered by the organic packaging layer; and an organic planarization layer 44 disposed on an uneven region of the second inorganic packaging layer 43.

In an embodiment, the inorganic layer in the driving circuit layer comprises one or more of a gate insulating layer, an interlayer insulating layer, an inorganic buffer layer, etc.

A manufacturing process of the retaining wall is now explained.

Figure 2:
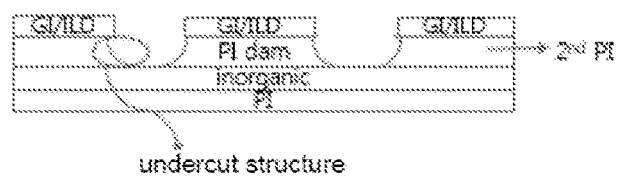
FIGS. 2, 3, 4, 5, 6, 7 and 8 are schematic views of manufactures of the retaining wall of the OLED display panel provided by the embodiment of the present invention.

Step 1. As shown in FIG. 2, a second flexible substrate (2nd PI), an interlayer insulating layer (ILD) and a gate insulating layer (GI) are formed into an undercut structure by dry etching. A PI dam (that is, the above substrate retaining wall layer 51) is formed in a middle of the undercut structure on both sides, and reserved regions of the interlayer insulating layer (ILD) and the gate insulating layer (GI) are used as the inorganic retaining layer 52.

Figure 3:

Step 2. As shown in FIG. 3, a planarization layer PLN, a pixel definition layer PDL, and a support column PS are disposed on the PI dam through a transistor TFT process to form a dam1 (that is, the above organic retaining layer 53).

Figure 4:

Step 3. As shown in FIG. 4, after an EL process of the light emitting layer is completed, a first vapor deposition (1st CVD) is performed to obtain the above first inorganic packaging layer 41 to cover the PI dam, the PLN, the PDL, and the PS.

Figure 5:
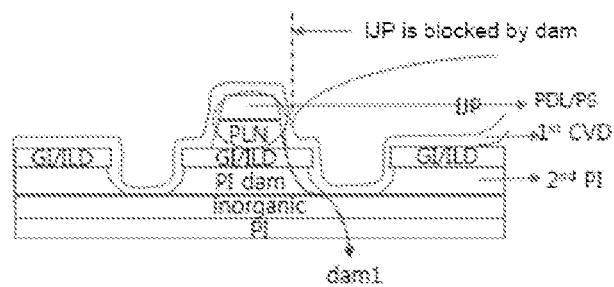

Step 4. As shown in FIG. 5, the organic packaging layer is formed. An organic material IJP that packages a TFE process will be blocked by a double dam consisting of PI dam and dam1 composed of PLN and PDL and PS, obtaining the above organic packaging layer 42.

Figure 6:
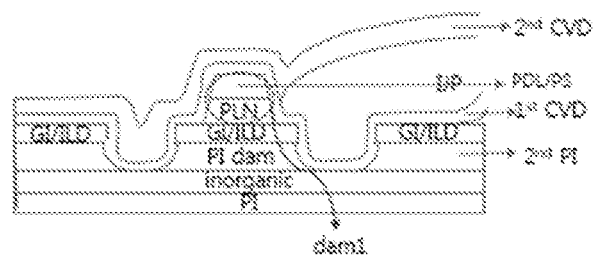

Step 5. As shown in FIG. 6, a second evaporation (2nd CVD) is used to obtain the above second inorganic packaging layer 43 to cover the IJP, the dam1 and the 1st CVD.

Figure 7:
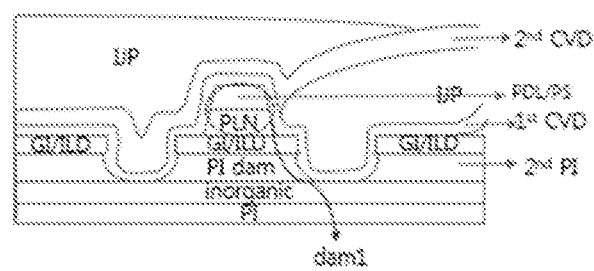

Step 6. As shown in FIG. 7, the organic material IJP process is performed to form an IJP planarization layer (that is, the above organic planarization layer 44) to fill the uneven regions on the 2nd CVD.

Figure 8:
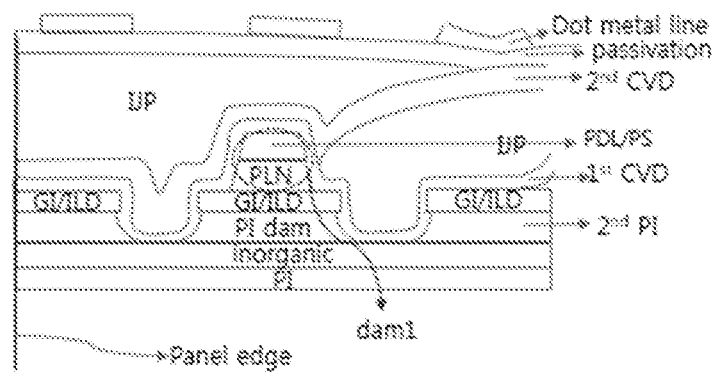

Step 7. As shown in FIG. 8, a touch DOT process is performed on the IJP planarization layer to form a passivation layer passivation and a touch trace Dot metal line, and then a laser cut to form final edges of the display panel.

The above embodiment describes the frame region, and a circuit film layer of the display region will now be described.

Figure 9:
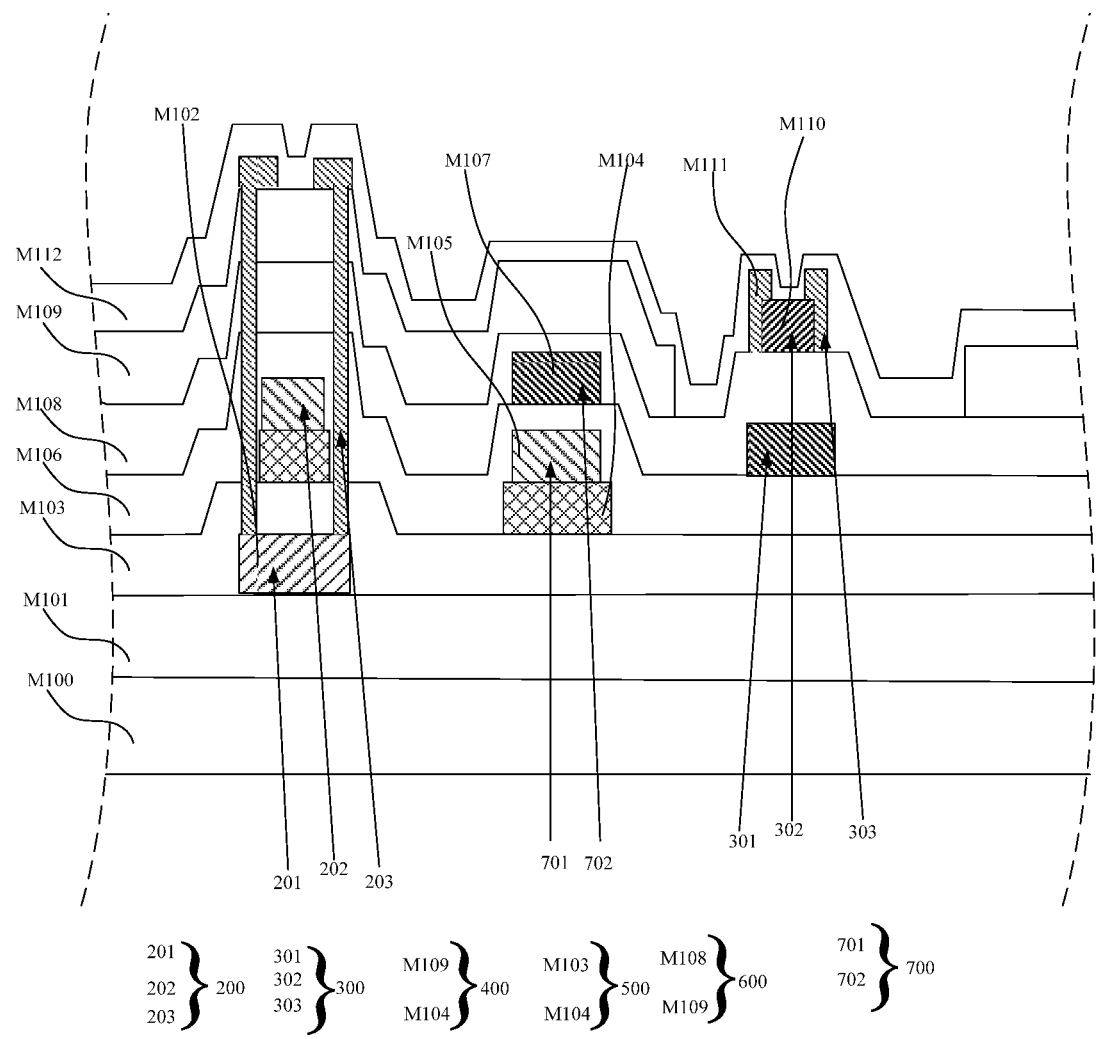
FIG. 9 is a schematic cross-sectional view of a display region of the OLED display panel provided by the embodiment of the present invention.

In an embodiment, as shown in FIG. 9, an array substrate 10 provided by the embodiment of the present invention comprises:

a substrate M100;

a low temperature polysilicon thin film transistor 200 and a metal oxide semiconductor thin film transistor 300 disposed on the substrate M100; and a hydrogen ion thin film 400 formed between an active layer 201 and a source-drain layer 203 of the low temperature polysilicon thin film transistor 200, and an opening is formed in a region where the metal oxide semiconductor thin film transistor 300 is disposed.

In the embodiment, based on a hydrogen element generated by the hydrogen ion thin film, it bonds with silicon atoms, thereby repairing defects in the aforementioned silicon film, and improving electrical characteristics and stability of the low temperature polysilicon thin film transistor. At the same time, the hydrogen element cannot diffuse to a region where the metal oxide semiconductor thin film transistor is set, and thus will not generate oxygen holes with the metal oxide of the metal oxide semiconductor thin film transistor, so as to avoid the electrical characteristics and stability of the metal oxide semiconductor thin film transistor from being affected by the hydrogen element, alleviating a technical problem that different types of thin film transistors in the prior art cannot work stably in the same display panel for a long time.

In an embodiment, as shown in FIG. 9, in the array substrate provided by the embodiment of the present invention, the array substrate 10 comprises a first insulating layer 500 disposed between an active layer 201 and a gate 202 of the low temperature polysilicon thin film transistor 200. The first insulating layer 500 comprises a first silicon oxide layer M103 and a first silicon nitride layer M104 stacked with each other. The first silicon nitride layer M104 is patterned to form a first hydrogen ion film in the hydrogen ion film 400.

In an embodiment, as shown in FIG. 9, in the array substrate provided by the embodiment of the present invention, the array substrate 10 comprises a second insulating layer 600 disposed between the gate 202 and the source-drain layer 203 of the low temperature polysilicon thin film transistor 200. The second insulating layer 600 comprises a second silicon dioxide layer M108 and a second silicon nitride layer M109. The second silicon nitride layer M109 is patterned to form a second hydrogen ion film in the hydrogen ion film 400.

In an embodiment, as shown in FIG. 9, in the array substrate provided by the embodiment of the present invention, the second silicon dioxide layer M108 is disposed between a gate 301 and an active layer 302 of the metal oxide semiconductor thin film transistor 300.

In an embodiment, as shown in FIG. 9, in the array substrate provided by the embodiment of the present invention, the array substrate 10 comprises a buffer layer M101 disposed on the substrate, and a third insulating layer M106 disposed between the gate 202 of the low temperature polysilicon thin film transistor 200 and the second insulating layer 600. The first silicon oxide layer M103 and the third insulating layer M106 are stacked between the buffer layer M101 and the gate 301 of the metal oxide semiconductor thin film transistor 300.

In an embodiment, a material of the third insulating layer M106 is silicon oxide to reduce complexity of the material.

In an embodiment, as shown in FIG. 9, in the array substrate provided by the embodiment of the present invention, the active layer 201 of the low temperature polysilicon thin film transistor 200 is disposed on the buffer layer M101.

In an embodiment, in the array substrate provided by the embodiment of the present invention, a material of the buffer layer M101 is silicon oxide to reduce complexity of the material.

In an embodiment, as shown in FIG. 9, in the array substrate provided by the embodiment of the present invention, the array substrate 10 further comprises a storage capacitor 700.

A first electrode plate 701 of the storage capacitor 700 and the gate 202 of the low temperature polysilicon thin film transistor 200 are disposed in a same layer. A second electrode plate 702 of the storage capacitor 700 and the gate 301 of the metal oxide semiconductor thin film transistor 300 are disposed in a same layer.

In an embodiment, as shown in FIG. 9, in the array substrate provided by the embodiment of the present invention, the array substrate 10 further comprises a protective layer M112. The first silicon oxide layer M103 and the first silicon nitride layer M104 are disposed between the buffer layer M101 and the first electrode plate 701 of the storage capacitor 700. The third insulating layer M106 is disposed between the first electrode plate 701 and the second electrode plate 702 of the storage capacitor 700. The second silicon dioxide layer M108 and the second silicon nitride layer M109 are disposed between the second electrode plate 702 of the storage capacitor 700 and the protective layer M112.

In an embodiment, in the array substrate provided by the embodiment of the present invention, the material of the protective layer M112 is silicon oxide to reduce complexity of the material.

In an embodiment, the polysilicon layer M102 is patterned to form the active layer 201 of the low temperature polysilicon thin film transistor 200.

In an embodiment, the first metal layer M105 is patterned to form the gate 202 of the low temperature polysilicon thin film transistor 200 and the first electrode plate 701 of the storage capacitor 700.

In an embodiment, the second metal layer M107 is patterned to form the second electrode plate 702 of the storage capacitor 700 and the gate 301 of the metal oxide semiconductor thin film transistor 300.

In an embodiment, materials of the first metal layer M105 and the second metal layer M107 are copper, or titanium aluminum titanium alloy, etc.

In an embodiment, the metal oxide layer M110 is patterned to form the active layer 302 of the metal oxide semiconductor thin film transistor 300.

In an embodiment, the source-drain layer M111 is patterned to form the source-drain 203 of the low temperature polysilicon thin film transistor 200 and a source-drain 303 of the metal oxide semiconductor thin film transistor 300.

In order to manufacture the array substrate in the embodiment shown in FIG. 9, an embodiment of the present invention further provides a manufacturing method of the array substrate. The manufacturing method of the array substrate comprises following steps:

Step 1. Providing the substrate, such as glass plate, transparent flexible substrate, etc.

Step 2. Forming a thin film transistor and a hydrogen ion thin film. The thin film transistor comprises a low temperature polysilicon thin film transistor and a metal oxide semiconductor thin film transistor disposed on the substrate. The hydrogen ion thin film is formed between the active layer and the source-drain layer of the low temperature polysilicon thin film transistor, and the opening is formed in a setting region of the metal oxide semiconductor thin film transistor.

In an embodiment, the manufacturing method of the array substrate provided by the present invention comprises following steps:

Step A. Depositing a silicon oxide film on the substrate M100 as the buffer layer M101 and depositing an amorphous silicon film on the buffer layer M101. High temperature is used to remove hydrogen atoms in the amorphous silicon film, a surface of the amorphous silicon film is cleaned through a cleaning process, and a laser is used to crystallize the amorphous silicon film into the polysilicon layer M102. A yellow light and etching process are used to form a polysilicon island 201, after removing a photoresist, ion implantation and other processes are used to adjust a threshold voltage of the thin film transistor. The yellow light process is used again to define a channel region, a source region and a drain region, and the ion implantation and other processes are used to make heavily doped source and drain regions, removing the photoresist.

Figure 10:
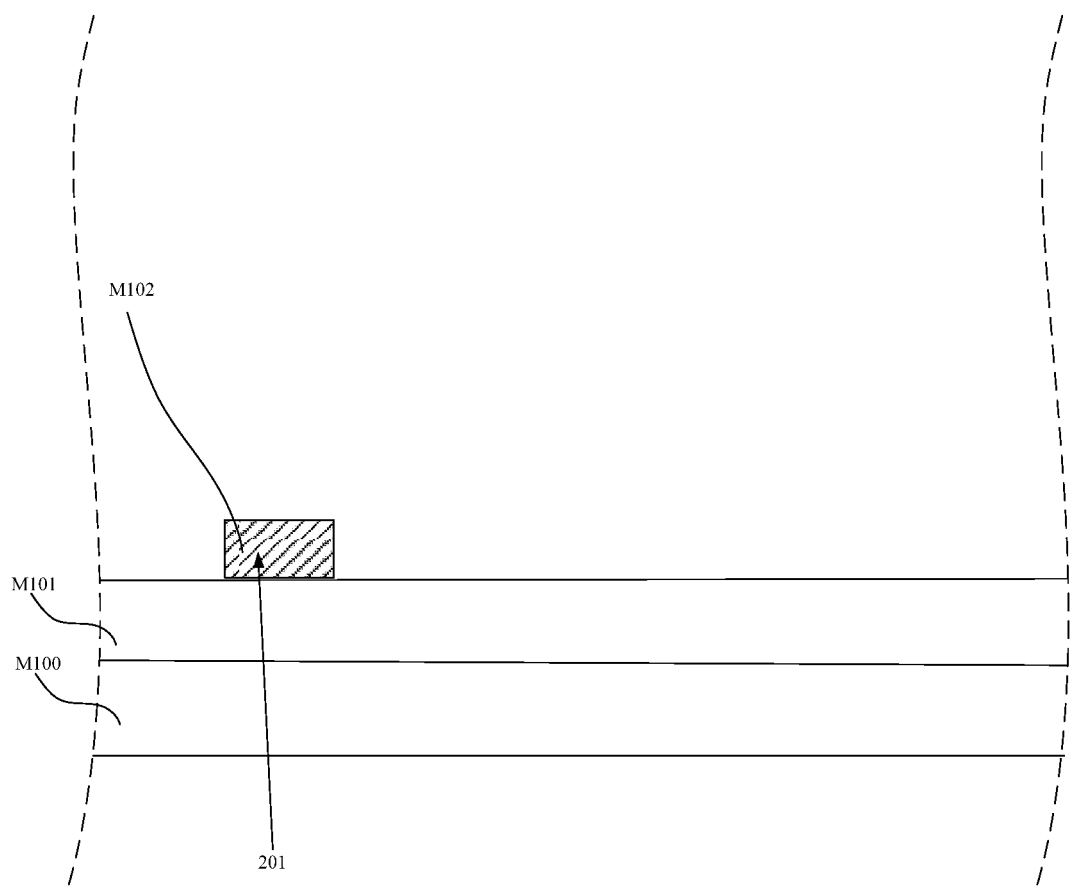
FIGS. 10, 11, 12, 13 14, 15, 16, 17 and 18 are schematic views of manufactures of the display region of the OLED display panel provided by the embodiment of the present invention.

After performing the step A, a structure shown in FIG. 10 is obtained.

Step B. Depositing a gate insulating layer (i.e., the above first insulating layer 500) on the polysilicon island 201. The gate insulating layer comprises two films of a first silicon oxide layer M103 and a first silicon nitride layer M104 sequentially.

Figure 11:
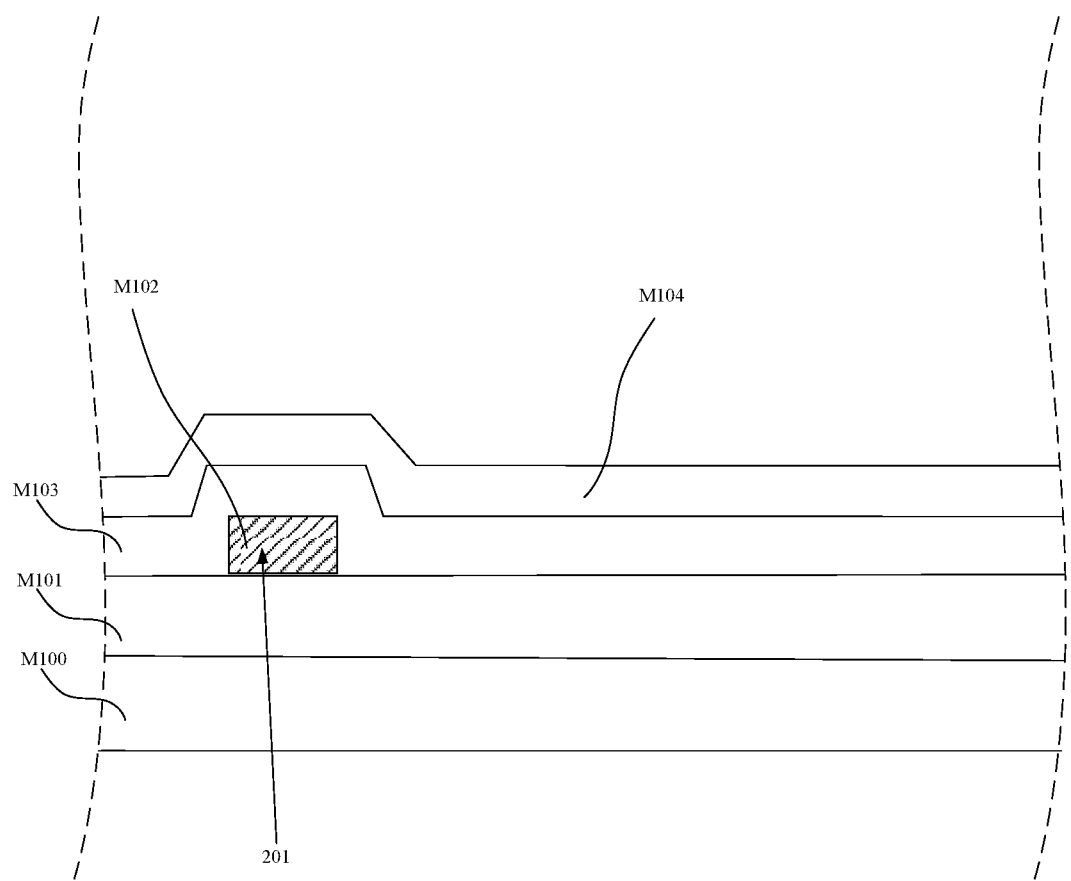

After performing the step B, a structure shown in FIG. 11 is obtained.

Step C. Depositing the first metal layer M105 on the gate insulating layer and defining a required first metal layer pattern using the yellow light/etch process, which comprising the gate 202 and the first electrode plate 701. While etching the first metal layer, process parameters of the dry etching are adjusted to etch and remove the first silicon nitride layer M104 except under the first metal layer pattern, removing a photoresist.

Figure 12:
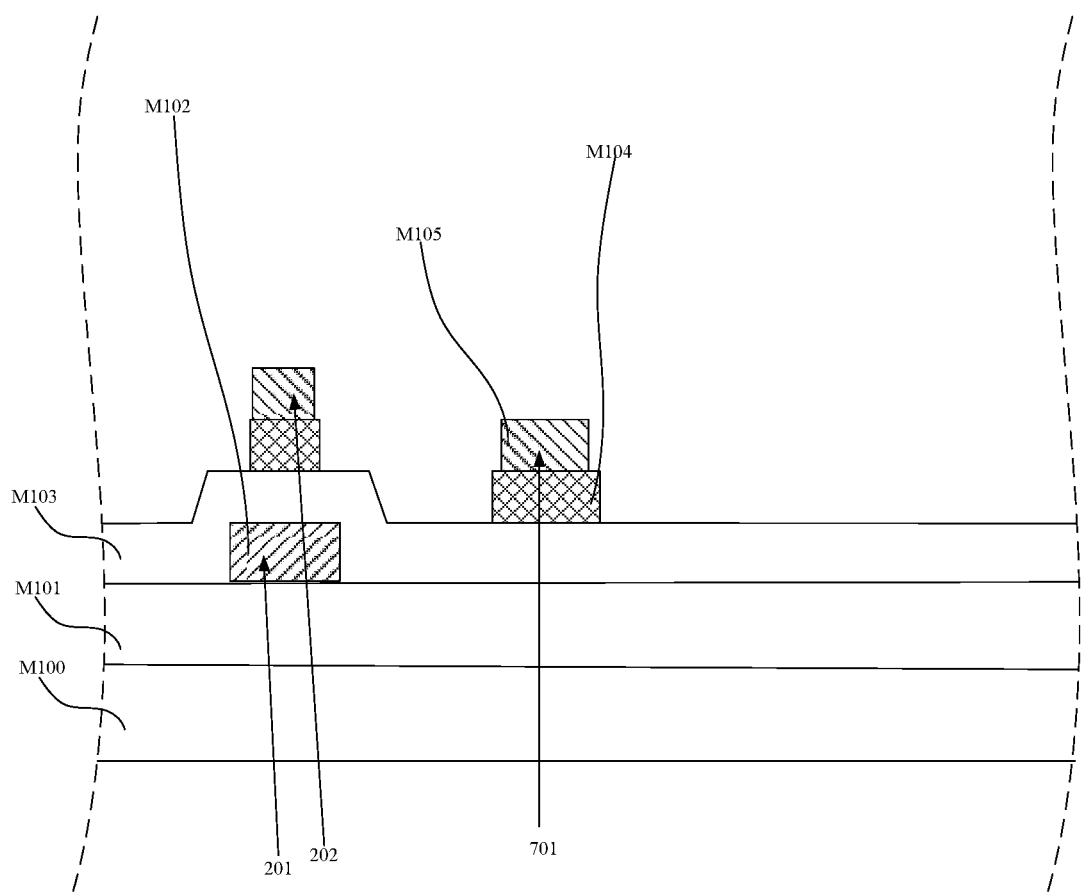

After performing the step C, a structure shown in FIG. 12 is obtained.

Step D. Depositing a silicon oxide layer on the first metal layer pattern as the dielectric interlayer between the two electrode plates of the storage capacitor 700 (i.e., the above third insulating layer M106).

Figure 13:
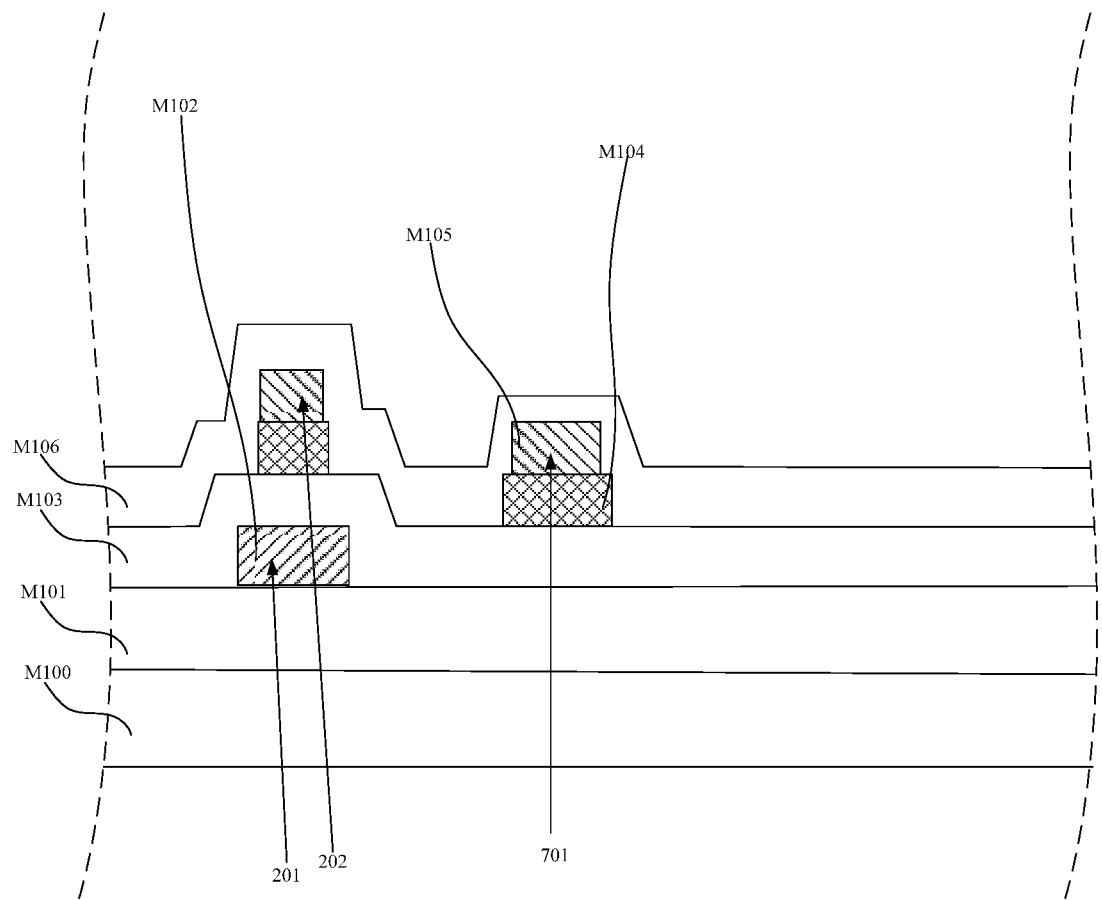

After performing the step D, a structure shown in FIG. 13 is obtained.

Step E. Depositing the second metal layer M107 on the dielectric interlayer and defining a second metal layer pattern using a yellow light/etch process, which comprising the second electrode plate 702 and the gate 301, removing a photoresist.

Figure 14:
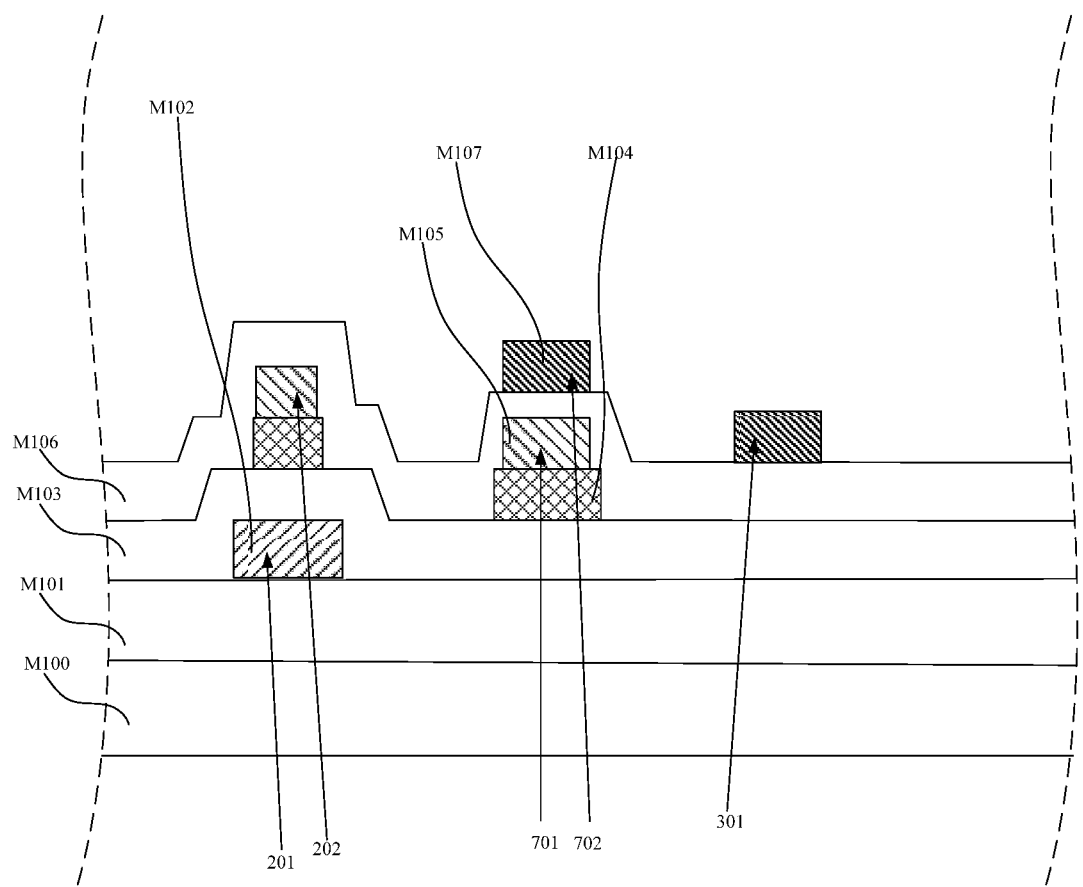

After performing the step E, a structure shown in FIG. 14 is obtained.

Step F. Depositing two dielectric layers (i.e., the above second insulating layer 600) of the second silicon dioxide layer M108 and the second silicon nitride layer M109 sequentially on the second metal layer pattern. The dielectric layers are disposed between the gate 202 and the source-drain metal layer M111.

Figure 15:
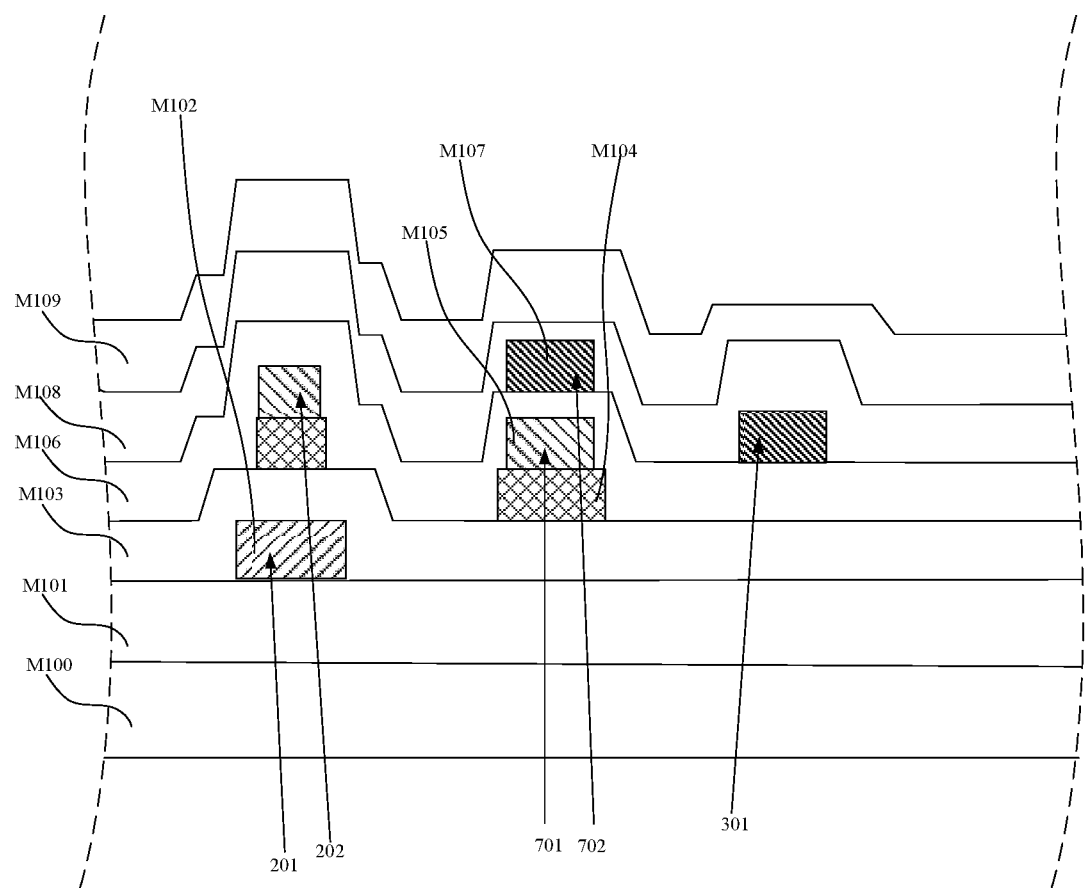

After performing the step F, a structure shown in FIG. 15 is obtained.

Step G. Using a gray scale photomask to form a photoresist pattern of FIG. 16. A first part is a via hole connected to polysilicon. The part removes all exposure/development of the photoresist. A second part is a photoresist on the gate 301. The part is a region of the gray scale photomask, and only part of a thickness of the photoresist is removed.

Figure 16:
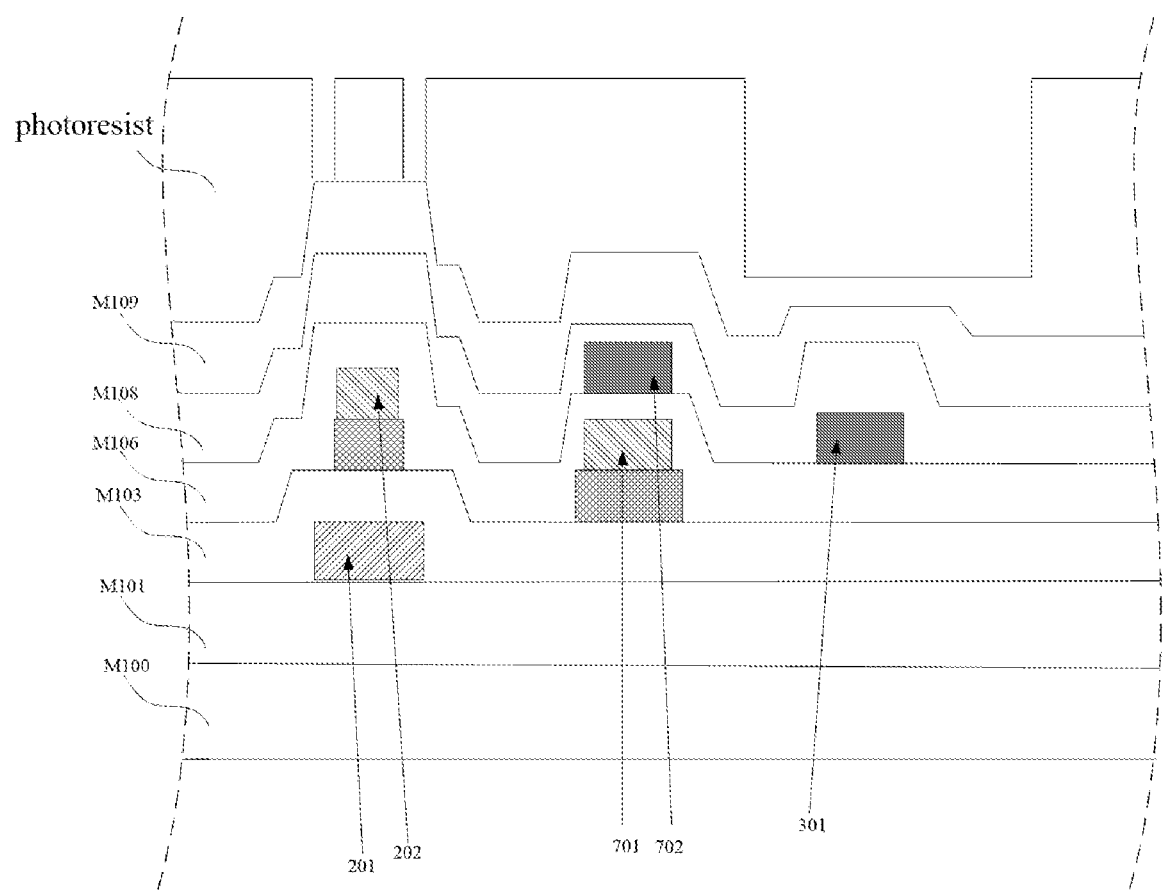

After performing the step G, a structure shown in FIG. 16 is obtained.

Step H. Dry etching the array substrate with the photoresist made in FIG. 16. The via hole of the active layer 201 is etched away, and the second silicon nitride layer M109 on the metal oxide semiconductor thin film transistor is also etched away, removing the photoresist.

Figure 17:
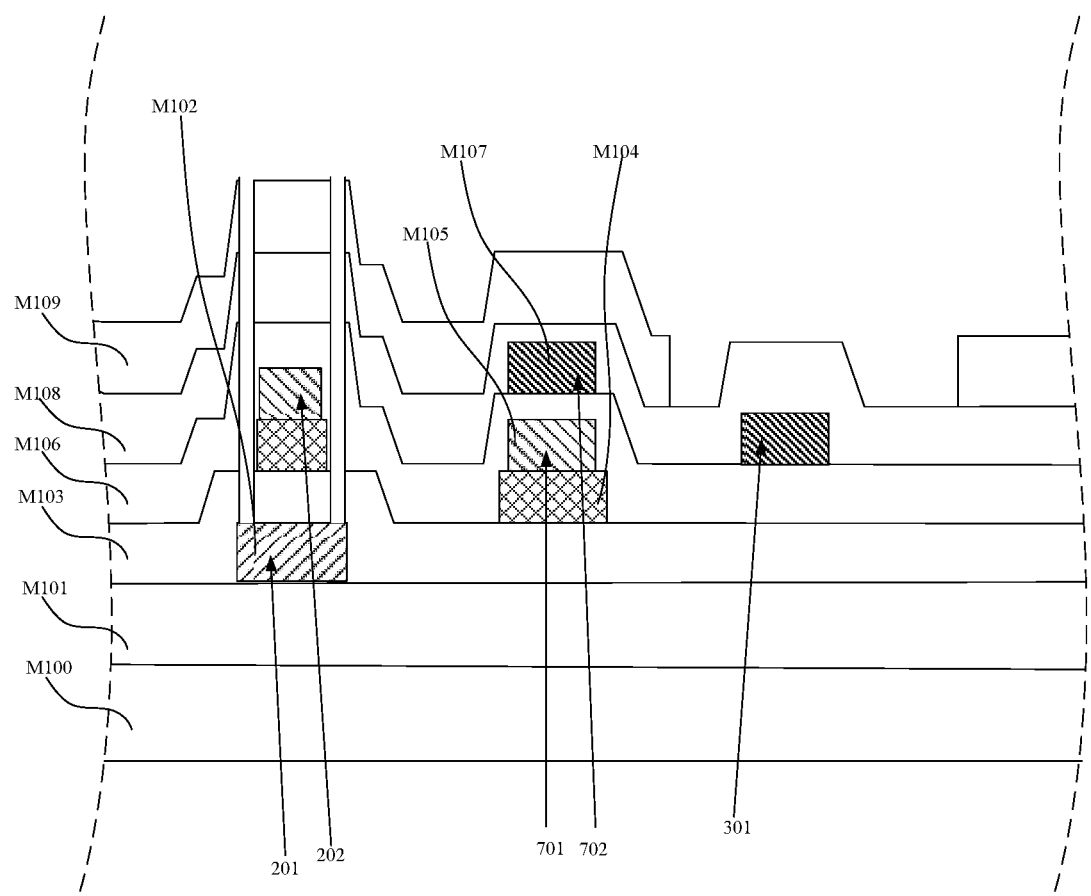

After performing the step H, a structure shown in FIG. 17 is obtained.

Step I. Depositing the metal oxide thin film (IGZO) layer M110 on the structure of FIG. 17 and defining a pattern of the oxide metal active layer using the yellow light/etch process. After removing the photoresist, deposit the source-drain metal layer M111 on top, and define the source-drain pattern (including the source-drain 203 and the source-drain 303) using the yellow light/etch process. After removing the photoresist, a silicon oxide layer is deposited on a source-drain pattern as the protective layer M112.

Figure 18:
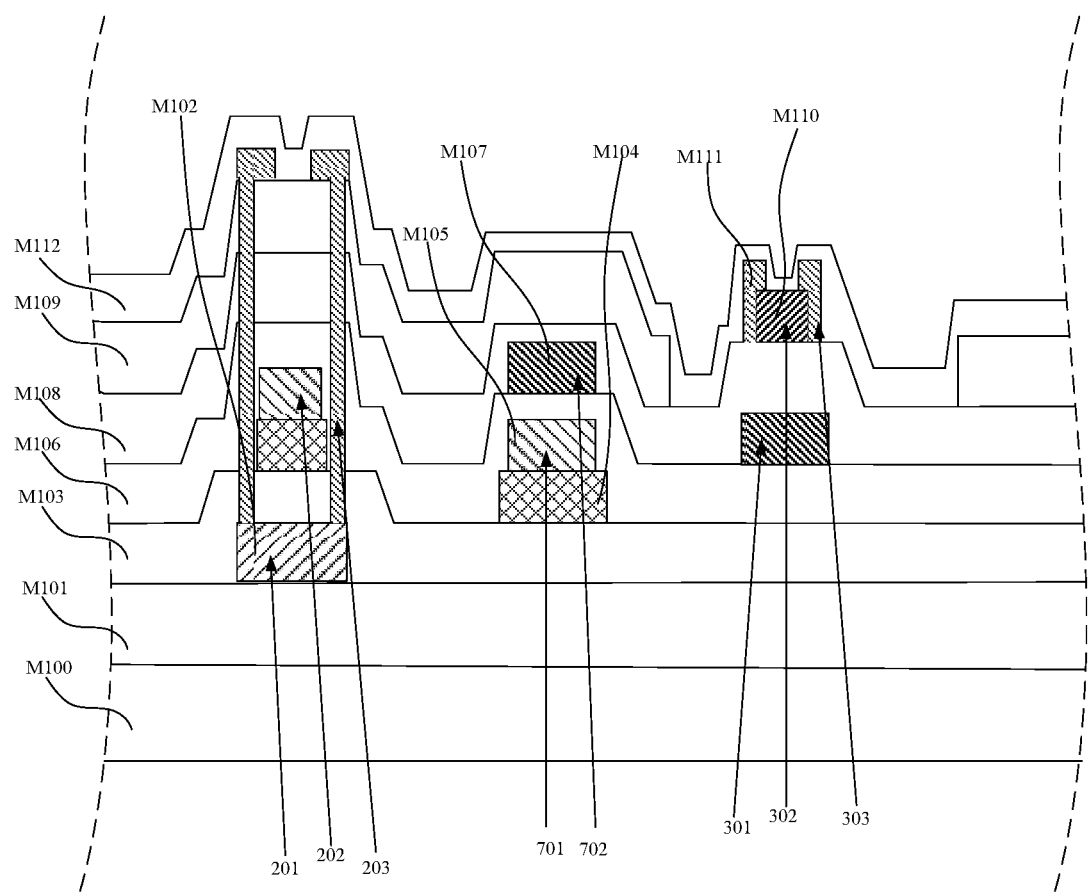

After performing the step I a structure shown in FIG. 18 is obtained.

In this way, the structure of the thin film transistor device has been completed, and different structures can be made according to needs of the OLED above, which will not be repeated here.

In an embodiment, the present invention further provides a display device, the display device comprises:
the above OLED display panel;
a touch panel disposed on the OLED display panel;
a polarizer disposed on the touch panel; and
a protective cover.

In an embodiment, the OLED display panel is cut to form a through hole. The display device further comprises a camera disposed under the through hole, and the camera is used for face recognition, or facial blood vessel recognition.

Figure 19:
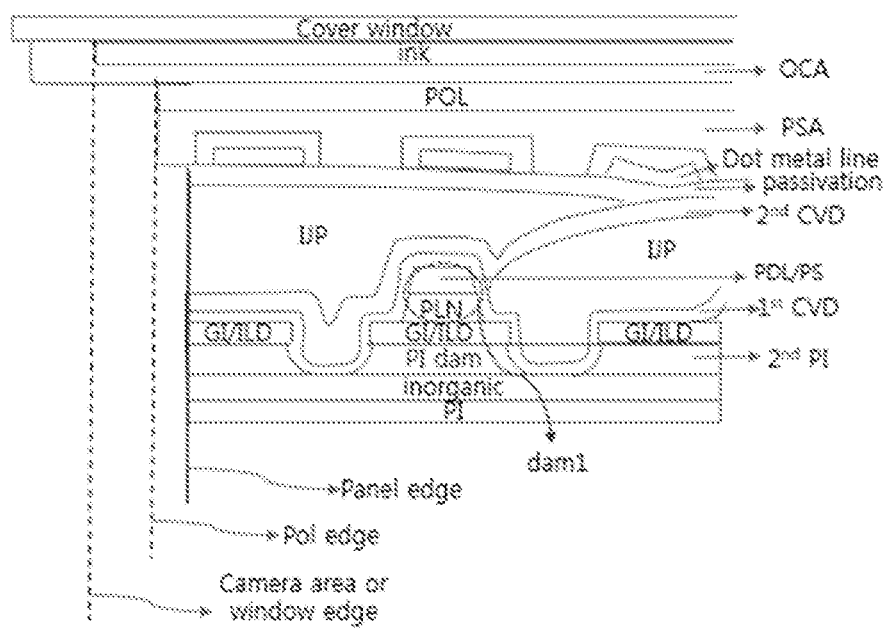
FIG. 19 is a schematic cross-sectional view of a frame region of a display device provided by the embodiment of the present invention.

Following the structure shown in FIG. 8, as shown in FIG. 19, a pressure sensitive adhesive PSA, a polarizer POL, a transparent optical adhesive OCA, and a protective cover window are coated with ink in a non-display region to avoid light leakage.

In the embodiment shown in FIG. 19, a size of the polarizer POL is slightly larger than a size of the display panel, and a size of the ink is slightly larger than a size of the polarizer POL. When in a position display region of the cutting region, the cutting region is used to cut a lighting via hole that forms the camera. At this time, a boundary of the ink is the camera setting region Camera area. When a position of the cutting region is outside the display region, the cutting region is used to cut to form a small plate. At this time, a boundary of the ink is a boundary of the protective cover window edge.

According to the above embodiment, it is known that:

The present invention provides an OLED display panel and a display device. The OLED display panel comprises: a flexible substrate comprising a first flexible substrate, a first inorganic layer, and a second flexible substrate; a driving circuit layer disposed on the second flexible substrate; a light emitting functional layer disposed on the driving circuit layer; a packaging layer disposed on the light emitting functional layer, and a retaining wall disposed between a cutting region and a display region; the retaining wall comprises a substrate retaining wall layer, an inorganic retaining wall layer, and an organic retaining wall layer stacked on each other, cross-sections of the inorganic retaining wall layer and the substrate retaining wall layer form an undercut shape, the substrate retaining wall layer comprises the second flexible substrate, the inorganic retaining wall layer comprises an inorganic layer in the driving circuit layer, and the organic retaining wall layer comprises at least one of a planarization layer, a pixel definition layer, and a support column. Based on the retaining wall structure, a height of the retaining wall is increased, which can better block the movements of organic materials and reduce a distance between the retaining wall and the display region. Meanwhile, the undercut shape between the retaining wall and the display region can also increase the moving paths of the organic materials, which can further reduce the distance between the retaining wall and the display region, and can prevent cutting cracks from extending to the display region along the inorganic layer and a substrate, which can further reduce frame sizes. That is, embodiments of the present invention can further reduce the frame sizes and increase screen ratios.

In the above, various other corresponding changes and modifications can be made according to the technical solutions and technical ideas of the present invention to those skilled in the art, and all such changes and modifications are within the scope of the claims of the present invention.

What is claimed is:

1. An organic light emitting diode (OLED) display panel having a cutting region and a display region, and comprising:
a flexible substrate comprising a first flexible substrate, a first inorganic layer, and a second flexible substrate;
a driving circuit layer disposed on the second flexible substrate;
a light emitting functional layer disposed on the driving circuit layer;
a retaining wall disposed between the cutting region and the display region of the organic light emitting diode (OLED) display panel; and
a packaging layer disposed on the light emitting functional layer, and the retaining wall,
wherein the retaining wall comprises a substrate retaining wall layer, an inorganic retaining wall layer, and an organic retaining wall layer stacked on each other, cross-sections of the inorganic retaining wall layer and the substrate retaining wall layer form an undercut shape, the substrate retaining wall layer comprises the second flexible substrate, the inorganic retaining wall layer comprises an inorganic layer in the driving circuit layer, and the organic retaining wall layer comprises at least one of a planarization layer disposed on the driving circuit layer, a pixel definition layer disposed on the planarization layer, and a support column disposed on the pixel definition layer.

2. The OLED display panel as claimed in claim 1, wherein the cutting region is disposed outside the display region, and the retaining wall is disposed in a frame between the cutting region and the display region.

3. The OLED display panel as claimed in claim 2, wherein the retaining wall is disposed around the display region.

4. The OLED display panel as claimed in claim 1, wherein the cutting region is disposed in the display region, and the retaining wall is disposed in a buffer region between the cutting region and the display region.

5. The OLED display panel as claimed in claim 4, wherein the retaining wall is disposed around the cutting region.

6. The OLED display panel as claimed in claim 1, wherein the cutting region comprises a panel cutting region and a via hole cutting region, the retaining wall comprises a first retaining wall and a second retaining wall, the first retaining wall is disposed on a frame between the cutting region and the display region, and the second retaining wall is disposed on a buffer region between the via hole cutting region and the display region.

7. The OLED display panel as claimed in claim 6, wherein the first retaining wall is disposed around the display region, and the second retaining wall is disposed around the cutting region.

8. The OLED display panel as claimed in claim 1, wherein a contact area of the substrate retaining wall layer and the inorganic retaining wall layer is greater than a contact area of the organic retaining wall layer and the inorganic retaining wall layer.

9. The OLED display panel according to claim 1, wherein the packaging layer comprises:
   a first inorganic packaging layer covering the retaining wall, the planarization layer, the pixel definition layer, the light emitting functional layer, and the support column, and extending to the cutting region;
   an organic packaging layer covering a portion of the first inorganic packaging layer disposed in the display region and extending to a side of the retaining wall close to the display region;
   a second inorganic packaging layer covering the organic packaging layer and a portion of the first inorganic packaging layer not covered by the organic packaging layer; and
   an organic planarization layer disposed on an uneven region of the second inorganic packaging layer.

10. A display device, comprising:
    an organic light emitting diode (OLED) display panel according to claim 1;
    a touch panel disposed on the OLED display panel;
    a polarizer disposed on the touch panel; and
    a protective cover.

* * * * *